United States Patent [19]
Kato et al.

[11] Patent Number: 5,764,361
[45] Date of Patent: Jun. 9, 1998

[54] INTERFEROMETER, ADJUSTING METHOD THEREFOR, STAGE APPARATUS HAVING THE INTERFEROMETER, AND EXPOSURE APPARATUS HAVING THE STAGE APPARATUS

[75] Inventors: Kinya Kato, Yokohama; Shigeru Takemoto, Kawasaki, both of Japan

[73] Assignee: Nikon Corporation, Tokyo, Japan

[21] Appl. No.: 734,078

[22] Filed: Oct. 21, 1996

[30] Foreign Application Priority Data

Oct. 20, 1995 [JP] Japan .................................. 7-297870

[51] Int. Cl.$^6$ .................................................. G01B 9/02
[52] U.S. Cl. ................................... 356/358; 356/363
[58] Field of Search ................................ 356/345, 358, 356/346, 363

[56] References Cited

U.S. PATENT DOCUMENTS

| | | | |
|---|---|---|---|
| 4,243,323 | 1/1981 | Breckinridge | 356/345 |
| 4,497,015 | 1/1985 | Konno et al. | 362/268 |
| 4,666,273 | 5/1987 | Shimizu et al. | 353/101 |
| 4,780,617 | 10/1988 | Umatate et al. | 250/548 |
| 5,015,866 | 5/1991 | Hayashi | 250/548 |
| 5,194,893 | 3/1993 | Nishi | 355/53 |
| 5,231,467 | 7/1993 | Takeuchi et al. | 356/363 |
| 5,253,110 | 10/1993 | Ichihara et al. | 359/619 |
| 5,333,035 | 7/1994 | Shiraishi | 355/77 |
| 5,404,222 | 4/1995 | Lis | 356/349 |
| 5,444,532 | 8/1995 | Sueyoshi | 356/349 |
| 5,561,524 | 10/1996 | Yamasaki et al. | 356/363 |

OTHER PUBLICATIONS

Tanitsu et al. "Illumination Optical Apparatus and Scanning Exposure Apparatus", Official Gazette, vol. 1170, No. 1, (1995).

Primary Examiner—David C. Nelms
Assistant Examiner—Robert Kim
Attorney, Agent, or Firm—Foley & Lardner

[57] ABSTRACT

This invention relates an interferometer having a structure for suppressing measurement errors arising from leakage light by minimizing nonlinear errors due to the leakage light in a polarization beam splitter for splitting incident light into a first polarized light component and a second polarized light component, and apparatuses to which the interferometer is applied. The interferometer includes an adjustment mechanism for adjusting the angle of light incidence on the beam splitting surface of the polarization beam splitter such that the extinction ratio of the polarization beam splitter is minimized by using the dependence of the polarization beam splitter on the incident angle.

14 Claims, 8 Drawing Sheets

INTERFEROMETER, ADJUSTING METHOD THEREFOR, STAGE APPARATUS HAVING THE INTERFEROMETER, AND EXPOSURE APPARATUS HAVING THE STAGE APPARATUS

BACKGROUND OF THE INVENTION

1. Field of the Invention

The present invention relates to a laser interferometer for distance measurements, an adjusting method therefor, a stage apparatus to which the interferometer is applied, and an exposure apparatus to which the stage apparatus is applied.

2. Related Background Art

A laser interferometer for distance measurements is used to accurately measure the relative displacement between two members in a projection exposure apparatus used to manufacture a semiconductor device, a liquid crystal display device, or the like, or in a high-precision machine tool. Generally, the laser interferometer for distance measurements generates an interference between a reference beam returned from a reference reflector (stationary mirror) a distance measurement beam returned from a measurement reflector device (movable mirror attached to the measurement target), thereby measuring the displacement of the movable mirror.

A conventional interferometer for distance measurements is disclosed in Japanese Patent Laid-Open No. 5-231816 in which the optical path length of the glass portion of a reference optical path including a stationary mirror is made equal to that of a measurement optical path including a movable mirror, thereby realizing a laser interferometer free from the influence of temperature variations.

SUMMARY OF THE INVENTION

In the conventional interferometer, generation of leakage light can not be prevented because a polarization beam splitter or the like includes manufacturing errors. The leakage light is a light component of polarized light, which should be transmitted through (or reflected by) the polarization beam splitter, though it is reflected (or transmitted) in fact. The leakage light directly reaches the receiver (photosensing device) without a round trip along a predetermined optical path and interferes with a main beam (reference beam or distance measurement beam) that has finished a round trip along the predetermined optical path. As a result, in the conventional interferometer, a phase shift is caused by the leakage light, and a distance measurement error is generated.

An object of the present invention is to provide a highly precise interferometer having a structure for suppressing distance measurement errors due to leakage light by minimizing nonlinear errors owing to the leakage light in a polarization beam splitter for splitting incident light into a first polarized light component and a second polarized light component, an adjusting method therefor, a stage apparatus to which the interferometer is applied, and an exposure apparatus to which the stage apparatus is applied.

The interferometer according to the present invention is a laser interferometer which accurately measures the displacement of a measurement target by using interference between light waves that have propagated along a measurement optical path and a reference optical path, respectively. Such a laser interferometer is popularly used as the position measurement system of a stage apparatus such as a wafer stage or a mask stage in a one-shot or scan type exposure apparatus for which highly precise driving control is required.

As shown in FIGS. 1 and 2, a general exposure apparatus comprises at least a stage unit 3 allowing a photosensitive substrate W to be held on a major surface thereof, an illumination optical system 1 for illuminating a mask having a predetermined pattern formed thereon with exposure light having a predetermined wavelength, and a projection optical system 5 for projecting the image of the pattern on the mask onto the photosensitive substrate W. As shown in FIG. 6, a stage apparatus including the stage unit 3 (FIGS. 3 and 4) comprises at least a stage 600 having a major surface arranged to be in parallel with respect to a predetermined reference surface such as a floor surface on which the stage 600 is set and at least movable along directions orthogonal to each other on the reference surface, a driving system 310 (including motors 300A and 300B in FIGS. 3 and 4) for moving the stage 600 in the orthogonal directions (X- and Y-directions shown in FIG. 6) on the reference surface, and an interferometer generating an interference between measurement light that has propagated along a measurement optical path including a measurement reflector 201A or 201B (including 35A or 35B in FIG. 6) which is attached to the stage 600 and at least movable together with the stage 600 and reference light that has propagated along a reference optical path including a stationary reference reflector 202A or 202B (including 41A or 41B in FIG. 6), thereby measuring the displacement of the measurement reflector 201A or 201B. This interferometer is prepared in units of measurement directions (e.g., X-direction and Y-direction interferometers). The measurement optical path is an optical path between an optical element 63A or 63B and the measurement reflector 201A or 201B, through which the measurement light split by a beam splitting surface 630A or 630B of the optical element 63A or 63B travels. The reference optical path is an optical path between the optical element 63A or 63B and the measurement reflector 202A or 202B, through which the reference light split by the beam splitting surface 630A or 630B of the optical element 63A or 63B travels.

As shown in FIG. 6, the interferometer has the optical element 63A or 63B (e.g., a polarization beam splitter) having the beam splitting surface 630A or 630B for splitting incident light into a measurement light component and a reference light component, and an adjustment mechanism for changing the angle of incidence of incident light on the beam splitting surface 630A or 630B of the optical element 63A or 63B while supporting the optical element 63A or 63B. In other words, this adjustment mechanism uses the dependence of the polarization beam splitter on the angle of light incidence to adjust the angle of light incidence on the beam splitting surface of the polarization beam splitter such that the extinction ratio of the polarization beam splitter is minimized.

More specifically, as shown in FIGS. 10 and 11, the adjustment mechanism comprises a supporting table 630 for supporting, on its major surface 635, the optical element 63A having the beam splitting surface 630A, and a rotation mechanism (FIG. 11) for rotating the beam splitting surface 630A about an axis 640 perpendicular to the major surface 635 while the optical element 63A is supported to be in parallel with respect to the major surface 635 of the supporting table 630.

In particular, the adjustment mechanism of the interferometer of the present invention changes the angle of light incidence on the beam splitting surface such that the following condition is satisfied:

$Rp/Tp \leq 16(\pi \cdot \epsilon/\lambda)^2$ where Rp is the reflectivity of the beam splitting surface for the light component to be transmitted through the beam splitting surface of the polarization beam splitter, Tp is the transmittance of the beam splitting surface for the light component to be transmitted through the beam splitting surface of the optical element, λ is the wavelength of the incident light, and ε is the allowable measurement error of the interferometer.

The present invention will become more fully understood from the detailed description given hereinbelow and the accompanying drawings which are given by way of illustration only, and thus are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

DESCRIPTION OF THE PREFERRED EMBODIMENTS

The embodiments of an interferometer according to the present invention, an adjusting method therefor, a moving stage to which the interferometer is applied, and an exposure apparatus to which the moving stage is applied will be described below with reference to FIGS. 1 to 11.

The interferometer according to the present invention is a double-path type laser interferometer which accurately measures the displacement of a measurement target by using interference between light waves that have propagated along a measurement optical path and a reference optical path, respectively. This laser interferometer is popularly used as the position measurement system of a stage apparatus such as a wafer stage or a mask stage in a one-shot or scan type exposure apparatus for which highly precise driving control is required.

Figure 1:
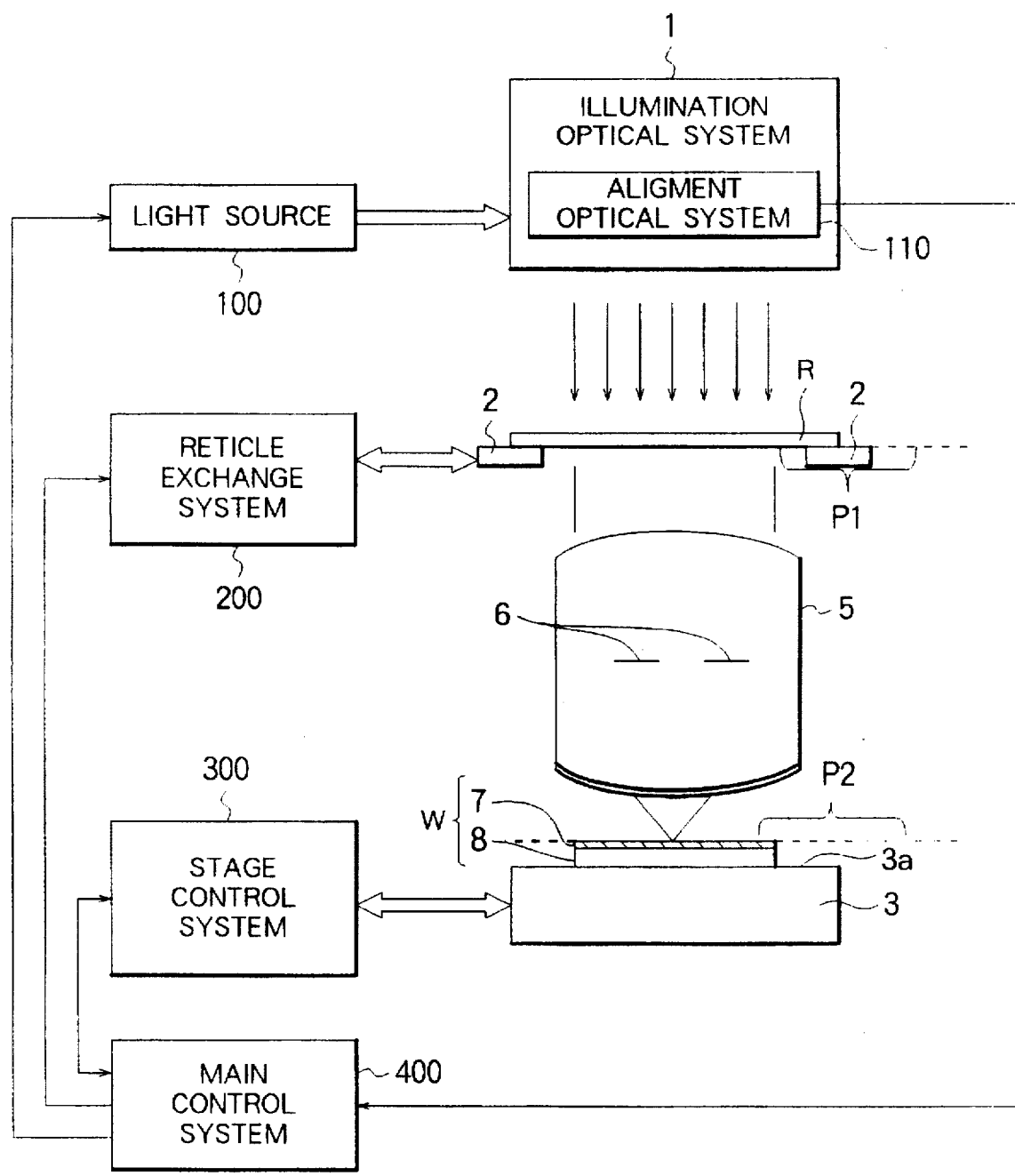
FIG. 1 is a view showing the structure of a one-shot type exposure apparatus to which an interferometer according to the present invention can be applied.

FIG. 1 is a view schematically showing the structure of a one-shot type exposure apparatus. As shown in FIG. 1, the exposure apparatus comprises a movable stage, i.e., a wafer stage unit 3 capable of holding a photosensitive substrate (wafer) W on its major surface 3a, a reticle stage unit 2 including a movable stage for holding a reticle R, a light source 100 for irradiating exposure light having a predetermined wavelength, and an illumination optical system 1 for irradiating the exposure light from the light source 100 on the reticle R and transferring a predetermined pattern of an electronic circuit or the like on the reticle R onto the substrate W through a projection optical system 5. The photosensitive substrate W is made by coating a photosensitive material 7 such as a photoresist on the surface of a base 8 such as a silicon wafer or a glass plate. The illumination optical system 1 has an alignment optical system 110 for aligning the reticle R and the photosensitive substrate W.

The exposure apparatus also comprises a reticle exchange system 200 for exchanging the reticle R to be held on the reticle stage unit 2 or moving the reticle stage unit 2 in accordance with an instruction from a main control section 400, and a stage control system 300 for moving the wafer stage unit 3 in accordance with an instruction from the main control section 400. When the reticle R and the photosensitive substrate W are to be aligned, the main control section 400 obtains the shift amounts of the photosensitive substrate W and the reticle R from the alignment optical system 110. The main control section 400 calculates the moving amounts of the stages of the stage units 2 and 3 and outputs moving instructions to the stage units 2 and 3, respectively. The stages of the stage units 2 and 3 are moved in predetermined directions in accordance with the moving instructions and moving amounts from the main control section 400, respectively, so that the relative position between the reticle R and the photosensitive substrate W is adjusted.

The projection optical system 5 is arranged between the reticle stage unit 2 and the wafer stage unit 3, i.e., between a first plane P1 (including an object surface) on the reticle R and a second plane P2 (including an image surface) on the photosensitive substrate W to project the image of a predetermined pattern on the reticle R onto the substrate W.

Figure 2:
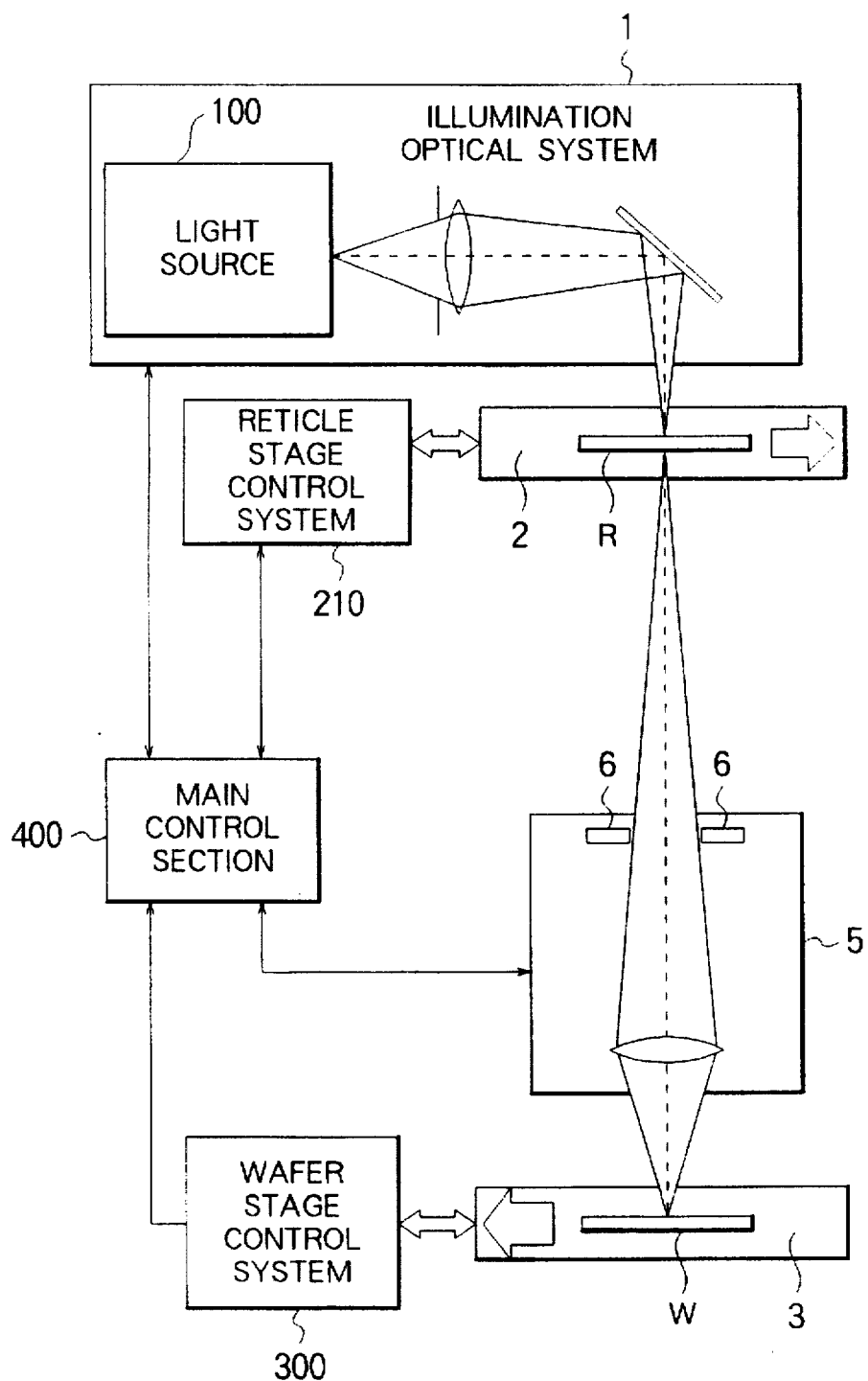
FIG. 2 is a view showing the structure of a scan type exposure apparatus to which the interferometer according to the present invention can be applied.

FIG. 2 is a view schematically showing the structure of a scan type exposure apparatus. Like the exposure apparatus shown in FIG. 1, the exposure apparatus of FIG. 2 also comprises a movable reticle stage unit 2, a movable wafer stage unit 3, an illumination optical system 1 (including a light source 100), and a projection optical system 5. The illumination optical system 1 irradiates exposure light from the light source 100 on an exposure region having a predetermined shape on a reticle R. The projection optical system 5 projects the pattern image on the region of the reticle R onto a substrate W (photosensitive substrate). A reticle stage control system 210 can change the position of the reticle R relative to the substrate W by moving the reticle stage unit 2 in a predetermined direction while holding the reticle R. The reticle stage control system 210 is included in a reticle exchange system 200. Similarly, a wafer stage control system 300 changes the position of the substrate W relative to the reticle R by moving the wafer stage unit 3 in a predetermined direction while holding the substrate W. A computer system serving as a main control section 400 independently controls the reticle stage control system 210 and the wafer stage control system 300. With this arrangement, this exposure apparatus can perform a scan type exposure operation by changing the relative position between the exposure region on the substrate W and the irradiation region on the reticle R.

Techniques associated with the above-described exposure apparatuses are disclosed in, e.g., U.S. patent application Ser. Nos. 08/255,927, 08/260,398, and 08/299,305, and in, e.g., U.S. Pat. Nos. 4,497,015, 4,666,273, 5,194,893, 5,253,110, 5,333,035, and 5,379,091. The catadioptric optical system of the present invention can be applied to all the exposure apparatuses disclosed in the above prior arts.

U.S. patent application Ser. No. 08/255,927 discloses an illumination optical system (using a laser source) applicable to a scan type exposure apparatus. U.S. patent application Ser. No. 08/260,398 discloses an illumination optical system (using a lamp source) applicable to a scan type exposure apparatus. U.S. patent application Ser. No. 08/299,305 discloses an alignment optical system applicable to a scan type exposure apparatus. U.S. Pat. No. 4,497,015 discloses an illumination optical system (using a lamp source) applicable to a general exposure apparatus. U.S. Pat. No. 4,666,273 discloses an example of a step and repeat type exposure apparatus. U.S. Pat. No. 5,194,893 discloses a scan type exposure apparatus and, more particularly, an illumination optical system, an illumination region, a mask-side/reticle-side interference system, an autofocusing mechanism, and an alignment optical system. U.S. Pat. No. 5,253,110 discloses an illumination optical system (using a laser source) applicable to a step and repeat type exposure apparatus. The illumination optical system disclosed in this prior art can also be applied to a scan type exposure apparatus. U.S. Pat. No. 5,333,035 discloses a modified illumination optical system applicable to a general exposure apparatus. U.S. Pat. No. 5,379,091 discloses an illumination optical system (using a laser source) applicable to a scan type exposure apparatus.

Figure 3:
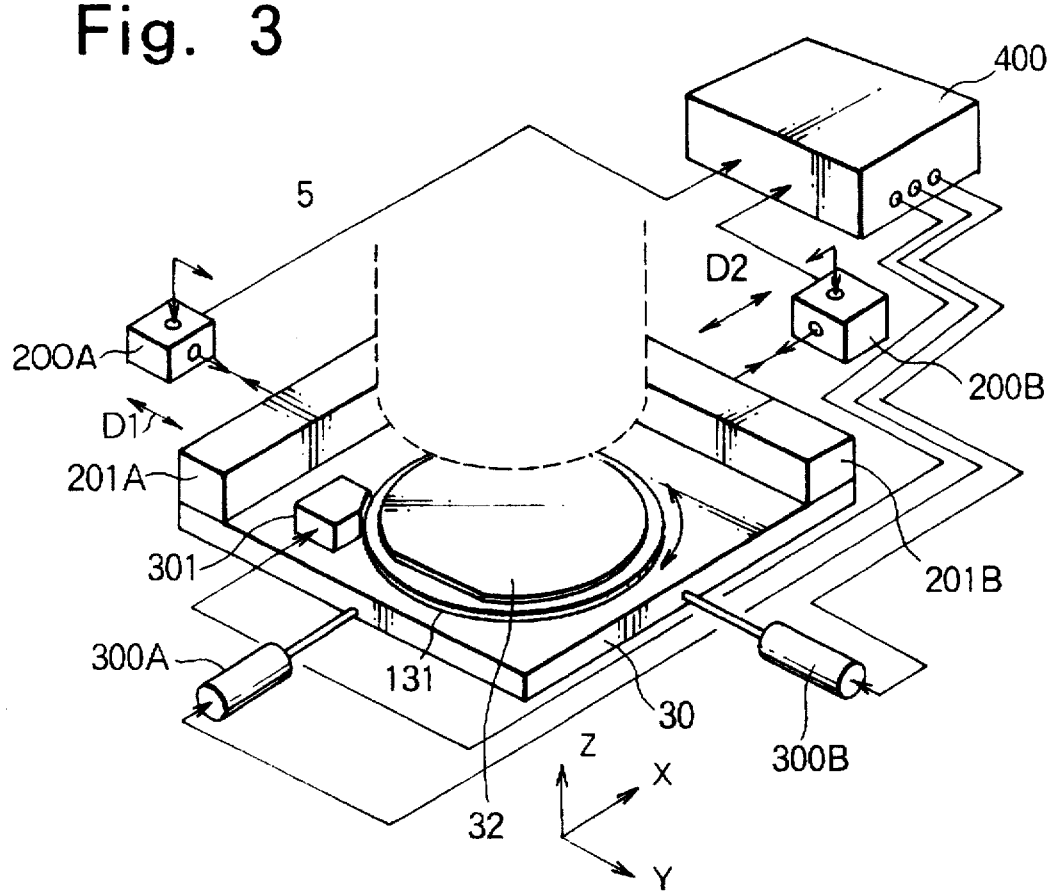
FIG. 3 is a perspective view showing the structure of the stage apparatus of the exposure apparatus shown in FIG. 1 or 2, to which the interferometer according to the present invention is applied.
Figure 4:
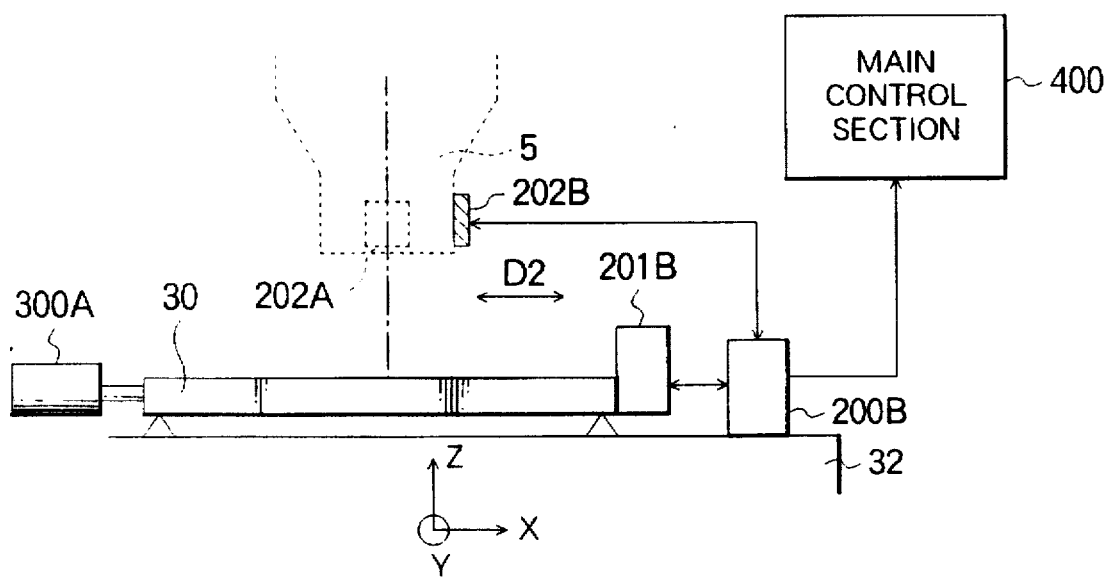
FIG. 4 is a side view of a moving stage shown in FIG. 3.

An application example of the interferometer according to the present invention will be described below. FIGS. 3 and 4 are views schematically showing the structure of the wafer stage unit 3 of an exposure apparatus to which the interferometer according to the present invention is applied as a position measurement system.

Generally, the wafer stage unit 3 of the exposure apparatus has a first stage 30 movable in the X- and Y-directions in FIGS. 3 and 4, and a second stage 31 rotatably arranged on the first stage 30. A wafer 32 is set on the second stage 31, and the image of a predetermined pattern on a mask (e.g., a reticle) is formed on the wafer 32 by the projection optical system 5. A motor 300B moves the first stage 30 to a predetermined position along the Y-direction in accordance with a control signal from the main control section 400. A motor 300A moves the first stage 30 to a predetermined position along the X-direction in accordance with a control signal from the main control section 400. A motor 301 rotates the second stage 31 by a predetermined angle in accordance with a control signal from the main control section 400.

A movable mirror 201A is attached to the first stage 30 (target object) to be in parallel to the X-direction, so that the movable mirror 201A moves together with the first stage 30. The main portion of the interferometer is accommodated in a case 200A and set at a predetermined position opposing the movable mirror 201A, thereby constituting the first interferometer. Similarly, a movable mirror 201B is attached to the first stage 30 (target object) to be parallel to the Y-direction, so that the movable mirror 201B moves together with the first stage 30. The main portion of the interferometer is accommodated in a case 200B and set at a position opposing the movable mirror 201B, thereby constituting the second interferometer. Further, the stationary mirrors 202A, 202B are attached to predetermined portions on a side wall of the projection optical system 5, respectively.

With the above arrangement, the first interferometer measures a displacement amount D1 of the first stage 30 (displacement amount of the movable mirror 201A) along the Y-direction while the second interferometer measures a displacement amount D2 of the first stage 30 along the X-direction. For example, the position of the stage 30 after alignment of the wafer 32, or the position of the stage 30 before movement is defined as a reference position. In this case, the position of the stage 30 can be highly accurately specified on the basis of the reference position and the displacement amounts obtained from the first and second interferometers. Therefore, the main control section 400 can precisely drive/control the first stage 30 on the basis of the displacement information from the first and second interferometers.

Detailed structures of the wafer stage unit are disclosed in, e.g., U.S. Pat. Nos. 4,780,617, 5,015,866, and 5,404,222. The reticle stage unit 2 also has the driving system and the measuring system including the X-direction interferometer and the Y-direction interferometer.

A distance measurement error generated by leakage light in the interferometer will be described below. The description will be made referring to transmission light transmitted through the polarization beam splitter.

A large part of a p-polarized light component having an angular frequency ω is transmitted through the polarization beam splitter and becomes transmission light having an amplitude A. The remaining part of the p-polarized light component is reflected by the polarized beam splitter and becomes reflection light having an amplitude α. The transmission light completes a round trip to the movable mirror (measurement reflecting mirror) as a main beam along the measurement optical path and is received by a photoreceiver. However, the reflection light is directly received by the photoreceiver as leakage light.

A synthesized amplitude Ep of the p-polarized light component in the photoreceiver (photo-sensing device) is given by the following equation (1):

$$Ep = A \cdot \exp\{i(\omega t - \phi)\} + \alpha \exp(i\omega t) \quad (1)$$

where t: time

φ: phase that depends on movement of the movable mirror (displacement amount of target object).

In equation (1), α<<A

By using parameters $\alpha_a$ and $\phi_a$ defined by equations (2) to (4) below, equation (1) can be rewritten as equation (5):

$$\alpha_a = \alpha/A \ll 1 \quad (2)$$

$$\cos\phi_a = (\alpha_a + \cos\phi)/(1 + \alpha_a^2 + 2\alpha_a \cdot \cos\phi)^{1/2} \quad (3)$$

$$\sin\phi_a = \sin\phi/(1 + \alpha_a^2 + 2\alpha_a \cdot \cos\phi)^{1/2} \quad (4)$$

-continued $$Ep/A = \exp(i\omega t)\{\exp(-i\phi) + \alpha_a\} \quad (5)$$
$$= (1 + \alpha_a^2 + 2\alpha_a \cdot \cos\phi)^{1/2}\exp(i\omega t)\exp(-i\phi_a)$$

Since $\phi$ and $\phi_a$ are approximate values, an approximate expression (7) is obtained by using a parameter $\delta_a$ defined by equation (6):

$$\delta_a = \phi_a - \phi, \ |\delta_a| \ll 1 \quad (6)$$

$$\delta_a \approx \sin(\phi_a - \phi) = \sin\phi_a \cos\phi - \cos\phi_a \sin\phi \quad (7)$$

When the relationship between equation (3) and equation (4) is referred to, and the terms of second or higher degree of $\alpha_a$ are ignored, approximate expression (7) can be rewritten as approximate expression (8):

$$\delta_a \approx -\alpha_a \sin\phi/(1+\alpha_a \cos\phi) \approx -\alpha_a \sin\phi \quad (8)$$

A parameter $\phi$ in equation (8) is an amount which changes according to movement of the movable mirror (the function of the moving distance of the movable mirror). The phase error caused by interference between the leakage light and the main beam nonlinearly changes in accordance with the moving distance of the movable mirror, and as a result, a nonlinear measurement error is generated.

A maximum measurement error $\Delta$ is represented by the following equation (9):

$$\Delta = \delta_a \max \lambda/(2\pi) = \pm \alpha_a \lambda/2\pi \quad (9)$$

The beam splitting surface of the polarized beam splitter is formed by stacking a plurality of thin films. When the angle of light incidence on the beam splitting surface is changed even slightly, the polarization characteristics of the polarization beam splitter change largely. Therefore, when leakage light is generated because of a manufacturing error of the polarization beam splitter or the like, the ratio of a reflectivity Rp to a transmittance Tp for the p-polarized light, i.e., Rp/Tp can be minimized by appropriately changing the angle of light incidence. In other words, the angle of light incidence can be appropriately changed by rotating the entire polarization beam splitter, thereby minimizing the leakage light, and accordingly, any distance measurement error caused by the leakage light.

Similarly, a distance measurement error is also generated for reflection light which should be reflected by the polarization beam splitter.

Figure 5:
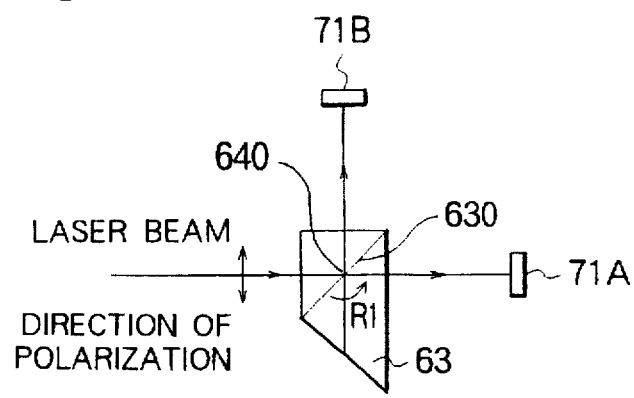
FIG. 5 is a view for explaining a method of measuring the extinction ratio of a beam splitter.

The extinction ratio of the polarization beam splitter (Rp/Tp is the extinction ratio for transmission light) can be measured by a measuring system shown in FIG. 5. Measurements of the extinction ratio of the polarization beam splitter for transmission light transmitted through the polarization beam splitter will be described below.

In the measuring system, transmission light split by a beam splitting surface 630 of a polarization beam splitter 63 is received by a first photoreceiver 71A at a position where the transmission light arrives. At the same time, leakage light reflected by the beam splitting surface 630 is received by a second photoreceiver 71B at a position where the leakage light arrives.

The transmittance of the beam splitting surface 630 for the transmission light is defined by the ratio of the amount of light incident on the polarization beam splitter 63 to the received light amount obtained from the first photoreceiver 71A. The reflectivity of the beam splitting surface 630 for the transmission light is defined by the ratio of the amount of incident light to the received light amount obtained from the second photoreceiver 71B. On the basis of these ratios, the extinction ratio (Rp/Tp) of the polarization beam splitter 63 for the transmission light can be obtained.

The present inventors measured the extinction ratio (Rp/Tp) of a polarization beam splitter for transmission light (p-polarized light component) by using the above measuring system, which polarization beam splitter was set at a predetermined reference position (the beam splitting surface was inclined by 45° with respect to incident light). According to the measurement results, when the beam splitting surface of the polarization beam splitter with Rp/Tp=1/100 was rotated by 1° in a direction indicated by an arrow R1 in FIG. 5, the extinction ratio (Rp/Tp) of the polarization beam splitter was decreased to 1/3000.

The extinction ratio (Rs/Ts) for reflection light (s-polarized light component) which should be reflected by the polarization beam splitter is measured in a similar manner.

The arrangement of the interferometer according to the present invention will be described below with reference to FIGS. 6 to 8.

Figure 6:
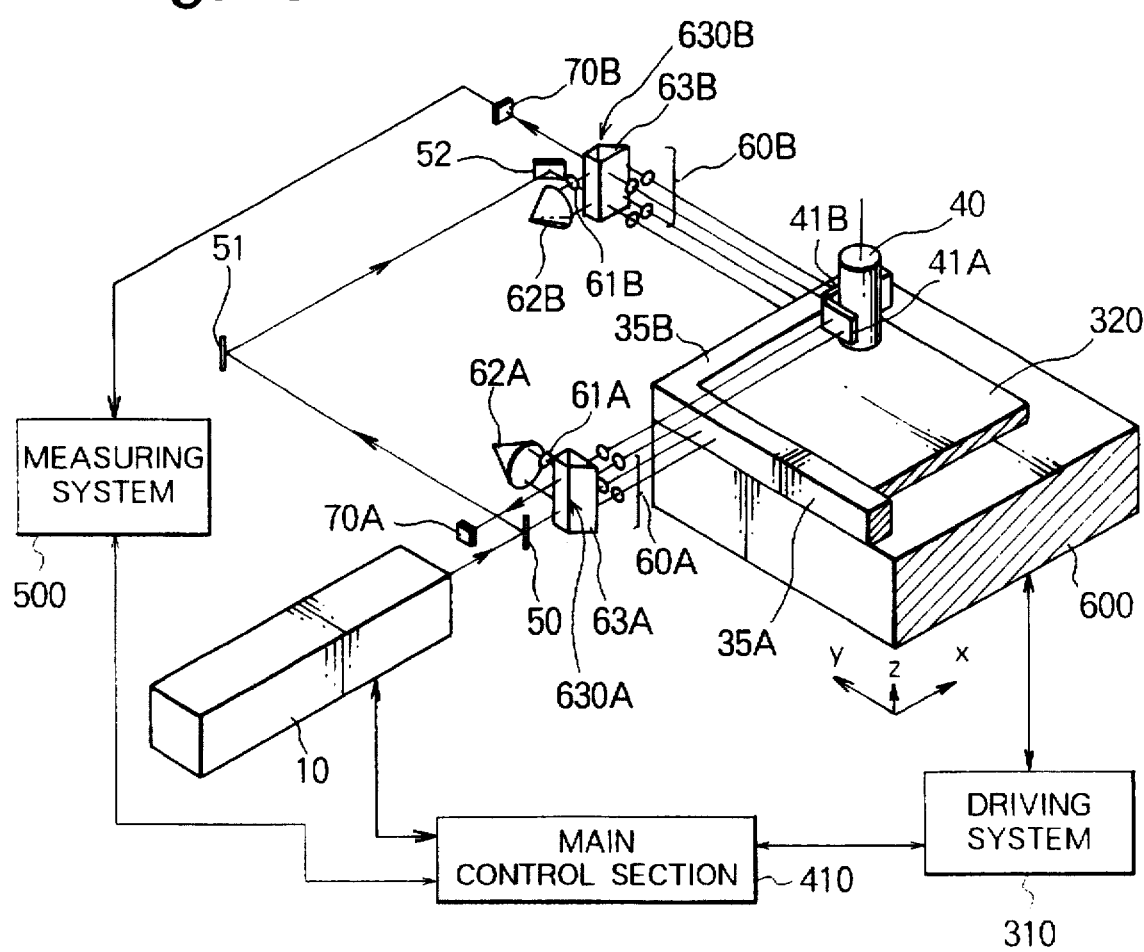
FIG. 6 is a view showing the structure of a general stage apparatus to which the interferometer according to the present invention is applied.
Figure 7:
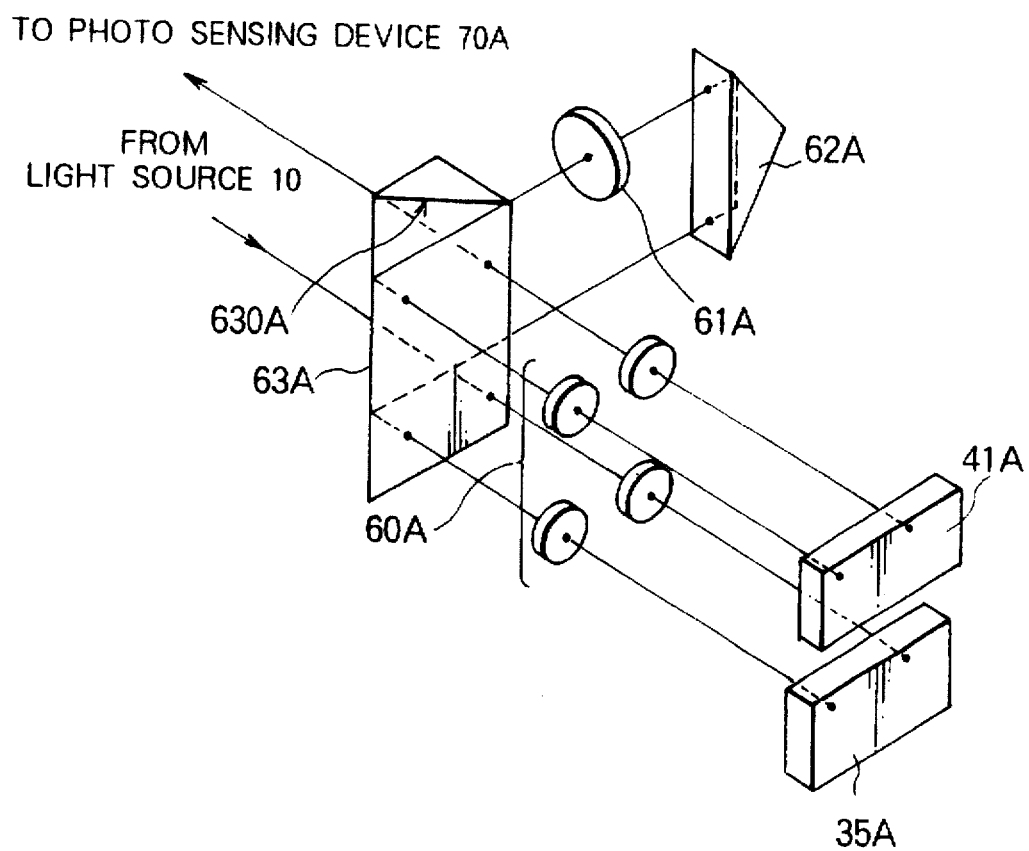
FIG. 7 is a view showing the reference optical path and the measurement optical path of the interferometer according to the present invention.

FIG. 6 is a perspective view schematically showing the arrangement of a stage apparatus to which the interferometer of the present invention is applied.

The interferometer shown in FIG. 6 has a laser source 10. A beam emitted from the laser source 10 is incident on a half mirror 50. A light component transmitted through the half mirror 50 is guided to the X-direction interference optical system while a light component reflected by the half mirror 50 is guided to the Y-direction interference optical system through mirrors 51 and 52.

As shown in FIG. 6, the X-direction interference optical system and the Y-direction interference optical system basically have the same arrangement. Therefore, for the X-direction interference optical system and the Y-direction interference optical system, elements basically having the same functions are represented by the same reference numerals. The constituent elements of the X-direction interference optical system are represented by reference numerals with a suffix A, and the constituent elements of the Y-direction interference optical system are represented by reference numerals with a suffix B.

The arrangement and operation of the X-direction interference optical system will be described below.

The beam guided to the X-direction interference optical system through the half mirror 50 is incident on a polarization half prism 63A. A light component (p-polarized light) transmitted through a beam splitting surface 630A of the polarization half prism 63A becomes a distance measurement beam and is incident on a movable mirror 35A arranged on a stage 600 through a associated quarter-wave plate 60A (propagates through the measurement optical path). The stage 600 is driven in the X- and Y-directions by a driving system 310 in accordance with an instruction from the main control section 400. The movable mirror 35A has a reflecting surface in parallel to the y-z plane that moves in accordance with X-direction movement of the stage 600. A movable mirror 35B of the Y-direction interference optical system has a reflecting surface in parallel to the x-z plane that moves in accordance with the Y-direction movement of the stage 600.

The distance measurement beam reflected by the reflecting surface of the movable mirror 35A returns along the forward optical path and is incident on the quarter-wave plate 60A again. The distance measurement beam is converted into s-polarized light by the quarter-wave plate 60A, reflected by the beam splitting surface 630A of the polarization half prism 63A, translated from the above reciprocating path in the Y-direction by a predetermined distance, and incident on the associated quarter-wave plate 60A. The beam transmitted through the quarter-wave plate 60A is incident on the movable mirror 35A again.

The distance measurement beam reflected by the reflecting surface of the polarization half prism 63A again returns along the forward optical path and is incident on the quarter-wave plate 60A again. The distance measurement beam is converted into p-polarized light again by the quarter-wave plate 60A, transmitted through the beam splitting surface 630A of the polarization half prism 63A (the optical path of the distance measurement beam converted into p-polarized light again is changed by the reflecting surface of the polarization half prism 63A), and incident on a corner cube 62A. The beam is translated by the corner cube 62A to the upper side in FIG. 6 (+Z direction) by a predetermined distance and emerges. The beam is converted into s-polarized light by a halfwave plate 61A and incident on the polarization half prism 63A (as shown in FIG. 7, the optical path of the distance measurement beam which propagates through the measurement optical path and is directed from the polarization half prism 63A to the corner cube 62A, and the optical path of the distance measurement beam directed from the corner cube 62A to the polarization half prism 63A are shifted from each other in the Z-direction). The distance measurement beam split by the beam splitting surface 630A of the polarization beam splitter 63 reaches a photo-sensing device 70A.

Of the beam guided to the X-direction interference optical system, a light component (s-polarized light) reflected by the beam splitting surface 630A of the polarization half prism 63A becomes a reference beam and is incident on the corner cube 62A. The beam is translated by the corner cube 62A to the upper side in FIG. 6 (+Z direction) by a predetermined distance is converted into p-polarized light by the halfwave plate 61A and incident on the polarization half prism 63A.

The reference beam transmitted through the beam splitting surface 630A of the polarization beam splitter 63 is incident, through the corresponding quarter-wave plate 60A, on a stationary mirror 41A attached to a measurement probe 40 (propagates along a reference optical path including a stationary mirror 41B). In the wafer stage unit 3 of the exposure apparatus, the stationary mirror is attached to the projection optical system 5. The measurement probe 40 is the objective lens of an optical system for detecting a pattern on a substrate 320 mounted on the stage 600 and fixed in the X- and Y-directions. The stationary mirror 41A has a reflecting surface parallel to the y-z plane. The stationary mirror 41B of the Y-direction interference optical system has a reflecting surface in parallel to the x-z plane.

The reference beam reflected by the reflecting surface of the stationary mirror 41A returns along the forward optical path and is incident on the quarter-wave plate 60A again. The reference beam is converted into s-polarized light by the quarter-wave plate 60A, reflected by the beam splitting surface 630A of the polarization half prism 63A, translated from the round-trip path in the +Y-direction by a predetermined distance, and incident on the corresponding quarter-wave plate 60A. The beam transmitted through the quarter-wave plate 60A is incident on the stationary mirror 41A again.

The reference beam reflected by the reflecting surface of the stationary mirror 41A again returns along the forward optical path and is incident on the quarter-wave plate 60A again. The reference beam is converted into p-polarized light again by the quarter-wave plate 60A, transmitted through the beam splitting surface 630A of the polarization half prism 63A, and reaches the photo-sensing device 70A. The photo-sensing devices 70A and 70B are included in a measuring system 500 of the stage apparatus (FIG. 6).

Figure 8:
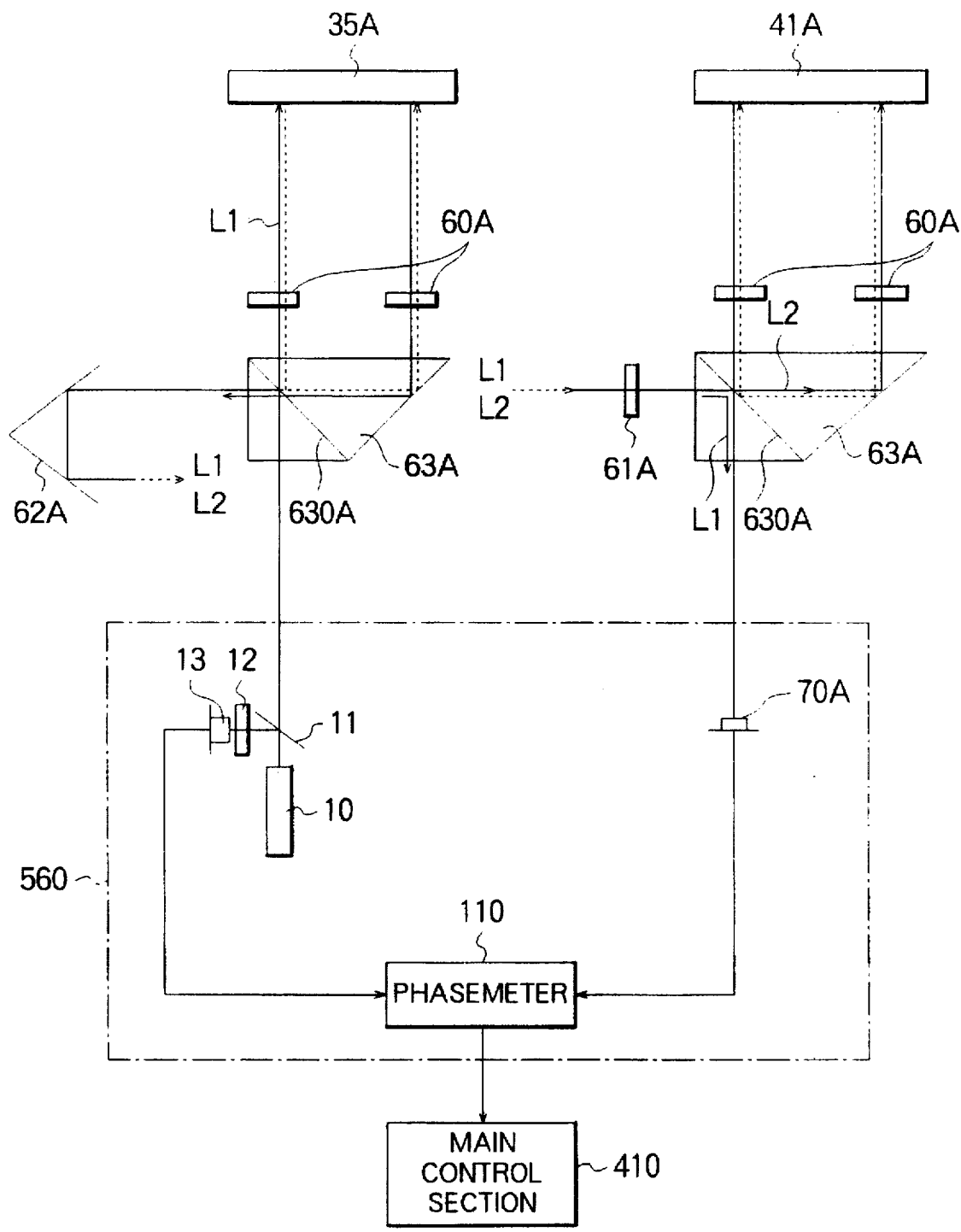
FIG. 8 is a view for explaining the principle of the interferometer according to the present invention.

In the measuring system 500 shown in FIG. 8, information (beat signal) associated with interference fringes formed by interference between the distance measurement beam, i.e., the returned light from a movable mirror 35A, and the reference beam, i.e., the returned light from a stationary mirror 41A, is input to a phasemeter 110. On the other hand, part of the beam (including an s-polarized light component and a p-polarized light component) emitted from the laser source 10 is split by the beam splitter and interferes with each other through a polarizing plate 12. Information (reference beat signal) associated with interference fringes formed by this interference is input to the phasemeter 110. The phasemeter 110 compares the input reference beat signal with the beat signal obtained from the photo-sensing device 70A and outputs the comparison result to a main control section 410. In this manner, the X-direction moving amount of the movable mirror 35A, i.e., the X-direction moving amount of the stage 600 (substrate 320) can be measured on the basis of the output from the photo-sensing device 70A.

The Y-direction moving amount of the movable mirror 35B, i.e., the Y-direction moving amount of the stage 600 (substrate 320) can be measured on the basis of the output from the photo-sensing device 70B of the Y-direction interference optical system.

Figure 9:
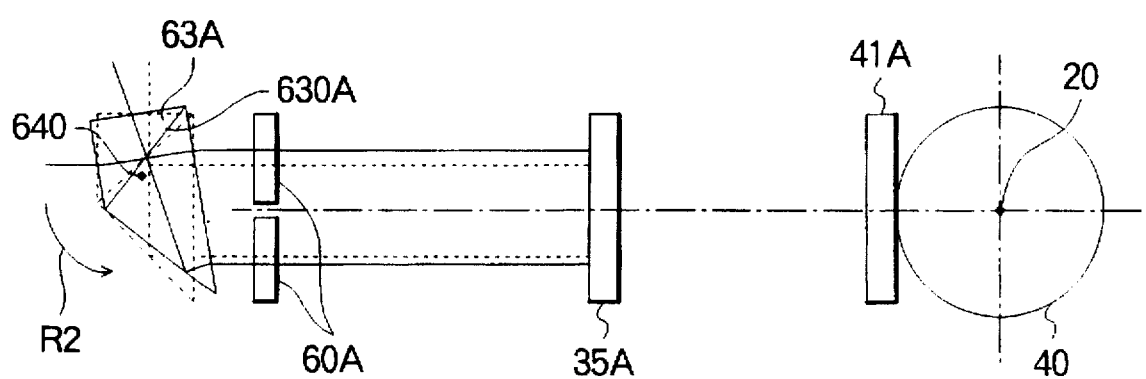
FIG. 9 is a view for explaining the adjustment operation of the interferometer according to the present invention.

FIG. 9 is a diagram of an optical path obtained by rotating the entire polarization half prism 63A (63B) to minimize leakage light in the beam splitting surface 630A (630B) of the polarization half prism 63A (63B) shown in FIG. 6. As shown in FIG. 9, the polarization half prism 63A and the optical path before rotation are indicated by broken lines, and those after rotation are indicated by solid lines.

As shown in FIG. 9, when the polarization half prism 63A is rotated in a direction indicated by an arrow R2 about an axis 640, the forward optical path of the distance measurement beam transmitted through the beam splitting surface 630A of the polarization half prism 63A is shifted from that before rotation to the upper side of FIG. 9. On the other hand, the backward optical path of the distance measurement beam totally reflected by the reflecting surface of the movable mirror 35A is shifted from that before rotation to the lower side in FIG. 9. As a result, the central line of the two distance measurement beams almost crosses a center 20 of the measurement probe 40, so that a so-called Abbe's condition is almost satisfied.

The optical path of the reference beam reflected by the beam splitting surface 630A of the polarization half prism 63A is angularly shifted from that before rotation in the direction indicated by the arrow R2 in FIG. 9. However, the reference beam reflected by the beam splitting surface 630A of the polarization half prism 63A is guided to become incident on the beam splitting surface 630A of the polarization beam splitter 63 again at the same angle by the corner cube 62A shown in FIG. 6. In this case, the corner cube 62A must be translated with respect to the reference surface on which the polarization half prism 63A is set, as needed, such that the entire reference beam after rotation is incident on the corner cube 62A. With this arrangement, even after rotation, the reference optical path and the measurement optical path can be superposed on each other in the x-y plane, so that the Abbe's condition can be satisfied.

In this embodiment, when the entire polarization half prism 63A is rotated about the axis 640 perpendicular to the reference surface in order to appropriately change the angle of light incidence on the beam splitting surface, leakage light, and accordingly, distance measurement errors can be minimized.

When the polarization half prism 63A is to be rotated, the polarization half prism 63A is preferably rotated about an axis (corresponding to the above-mentioned axis 640) almost perpendicular to the incident light within the beam splitting surface 630A.

The rotation reference of the polarization half prism 63A will be examined below with reference to the above-described equation (9).

Let $\alpha_a$ parameter=0.1 (corresponding to $Rp/Tp=\alpha_a^2=0.01$), and $\lambda$ (wavelength of laser beam)=633 nm in equation (9). Then, a distance measurement error $\Delta$ of about ±10 nm is generated at maximum in the measurement optical path. Considering that the interferometer according to the present invention is a double-path interferometer in which a light beam completes its round trip along a predetermined optical path twice, the maximum measurement error $\Delta$ in the measurement optical path is essentially about ±2.5 nm. In the reference optical path as well, the maximum measurement error $\Delta$ is about ±2.5 nm. Therefore, the maximum measurement error in this interferometer is about ±5 nm.

It is seen from equation (9) about that equation (10) below must hold:

$$\lambda \alpha_a / \pi \leq 4 \epsilon \tag{10}$$

where $\epsilon$ is the allowable measurement error of the interferometer.

In addition, it follows from equation (10) above that equation (11) below must hold:

$$\alpha_a^2 = Rp/Tp \leq 16(\pi \epsilon / \lambda)^2 \tag{11}$$

As is apparent from equation (11), to decrease the allowable measurement error $\epsilon$ to 1 nm or less, the entire polarization half prism 63A must be rotated such that $Rp/Tp \leq 1/2500$ holds.

The X-direction interference optical system has been basically described above. This description also applies to the Y-direction interference optical system.

Figure 10:
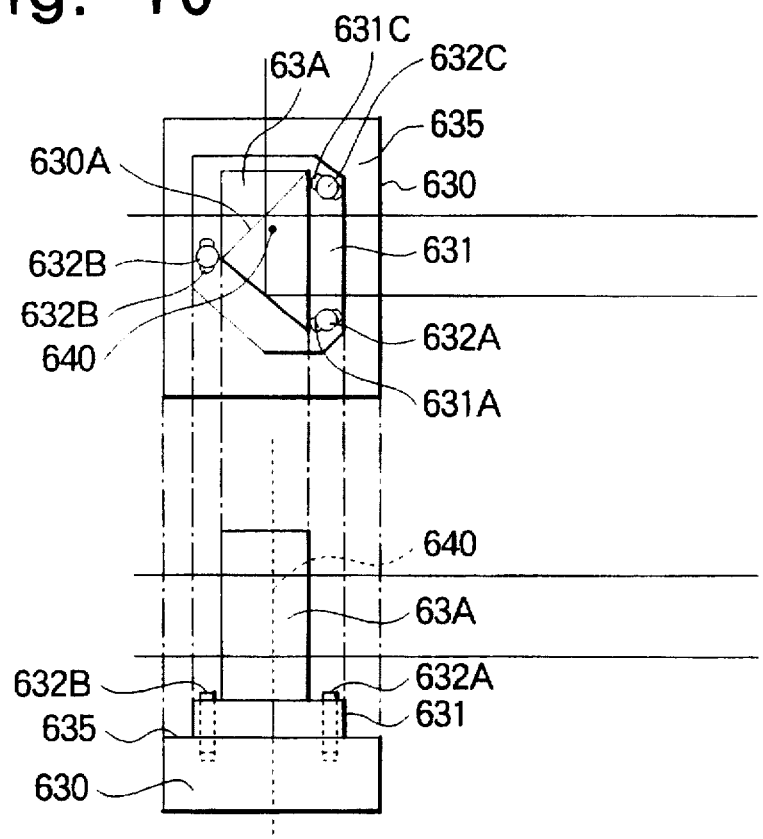
FIG. 10 is a view showing the structure of the adjustment mechanism of the interferometer according to the present invention.

The structure of the adjustment mechanism of the polarization half prism 63A will be described below with reference to FIGS. 10 and 11. The adjustment mechanism of the polarization half prism 63B included in the Y-direction interference optical system has the same arrangement.

The polarization half prism 63A is fixed on a reinforcing member 631, which is set on a major surface 635 of a supporting table 630, so that the polarization half prism 63A is supported above the major surface 635 of the supporting table 630. Through holes 631A, 631B, and 631C are formed in the reinforcing member 631 to extend in a direction perpendicular to the surface contacting the major surface 635 of the supporting table 630. Each of the through holes 631A, 631B, and 631C has an elongated section. The reinforcing member 631 is fixed at a predetermined position of the supporting table 630 (to surround the reinforcing member 631) and supported on the major surface 635 of the supporting table 630 while engaging pins 632A, 632B, and 632C extend through the reinforcing member 631 in a direction perpendicular to the major surface 635.

Figure 11:
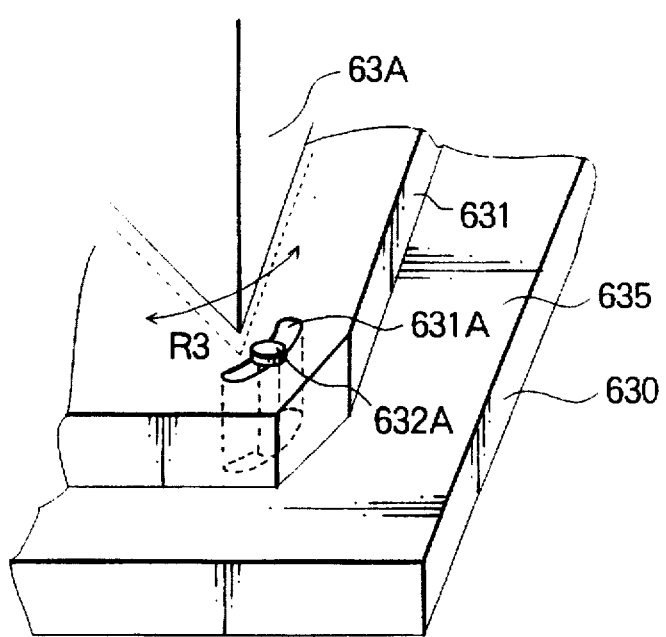
FIG. 11 is a view for explaining the adjustment operation of the adjustment mechanism shown in FIG. 10.

As shown in FIG. 11, the size and shape of each of the through holes 631A, 631B, and 631C are set such that the corresponding one of the engaging pins 632A, 632B, and 632C fixed to the supporting table 630 can move in a direction indicated by an arrow R3 in FIG. 11. With this structure, the adjustment mechanism of the interferometer of the present invention can rotate the reinforcing member 631 for supporting the polarization half prism 63A (beam splitting surface 630A) about an axis perpendicular to the major surface 635 of the supporting table 630. In other words, the beam splitting surface 630A of the polarization half prism 63A is rotatable about the axis 640 perpendicular to the major surface 635 of the supporting table 630.

In this embodiment, the angle of light incidence is changed by rotating the entire polarization half prism. However, the angle of light incidence on the beam splitting surface may be changed relatively by rotating the laser source instead of rotating the polarization half prism. In this case, the incident light must be appropriately translated with respect to the reference plane on which the polarization half prism is set such that the Abbe's condition is almost satisfied.

As has been described above, in the interferometer of the present invention, leakage light in the polarization half prism is minimized by adjusting the angle of light incidence on the beam splitting surface of the polarization half prism, so that measurement errors caused by the leakage light can be suppressed.

From the invention thus described, it will be obvious that the invention may be varied in many ways. Such variations are not to be regarded as a departure from the spirit and scope of the invention, and all such modifications as would be obvious to one skilled in the art are intended to be included within the scope of the following claims.

The basic Japanese Application No. 297870/1995 filed on Oct. 20, 1995 is hereby incorporated by reference.

What is claimed is:

1. An interferometer in which measurement light propagated through a measurement optical path including a measurement reflector which is at least movable along said measurement optical path and reference light propagated through a reference optical path including a stationary reference reflector are made to interfere with each other so as to measure a displacement of said measurement reflector, said interferometer comprising:

an optical element having a beam splitting surface for splitting incident light into a measurement light component and a reference light component; and an adjustment mechanism for changing an angle of incidence of the incident light on said beam splitting surface of said optical element while supporting said optical element.

2. An interferometer according to claim 1, wherein said adjustment mechanism comprises:

a supporting table for supporting said optical element having said beam splitting surface on a major surface thereof; and a rotation mechanism for rotating said beam splitting surface about an axis perpendicular to said major surface while said optical element is supported to be in parallel with respect to said major surface of said supporting table.

3. An interferometer according to claim 1, wherein said optical element is a polarization beam splitter having a surface as said beam splitting surface, which splits the incident light into a first polarized light component as the measurement light component and a second polarized light component as the reference light component, the first and second polarized light components having planes of polarization orthogonal to each other.

4. An interferometer according to claim 2, wherein said adjustment mechanism changes the angle of incidence of the incident light on said beam splitting surface such that the following condition is satisfied:

$$Rp/Tp \leq 16(\pi \cdot \epsilon/\lambda)^2$$

where Rp is the reflectivity of said beam splitting surface for a light component to be transmitted through said beam splitting surface of said optical element, Tp is the transmittance of said beam splitting surface for the light component to be transmitted through said beam splitting surface of said optical element, λ is the wavelength of the incident light, and ε is the allowable measurement error of said interferometer.

5. A method of adjusting an interferometer in which measurement light propagated through a measurement optical path including a measurement reflector which is at least movable along said measurement optical path and reference light propagated through a reference optical path including a stationary reference reflector are made to interfere with each other so as to measure a displacement of said measurement reflector, said method comprising the steps of:

setting, on a predetermined reference surface, an optical element having a beam splitting surface for splitting incident light into a measurement light component and a reference light component;

adjusting an angle of incidence of the incident light on said beam splitting surface of said optical element by rotating said beam splitting surface about an axis perpendicular to said reference surface while said optical element is supported to be in parallel with respect to said reference surface; and fixing said beam splitting surface of said optical element at a desirable angle such that a leakage light component reflected by said beam splitting surface, which should be transmitted through said beam splitting surface of said optical element, and a leakage light component transmitted through said beam splitting surface, which should be reflected by said beam splitting surface, are minimized.

6. A method according to claim 5, wherein the angle of incidence of the incident light on said beam splitting surface of said optical element is changed such that the following condition is satisfied:

$$Rp/Tp \leq 16(\pi \cdot \epsilon/\lambda)^2$$

where Rp is the reflectivity of said beam splitting surface for a light component to be transmitted through said beam splitting surface of said optical element, Tp is the transmittance of said beam splitting surface for the light component to be transmitted through said beam splitting surface of said optical element, λ is the wavelength of the incident light, and ε is the allowable measurement error of said interferometer.

7. A stage apparatus comprising:

a stage having a major surface to be set in parallel with respect to a predetermined reference surface;

a driving system for moving said stage at least along predetermined directions orthogonal to each other on said reference surface while said major surface of said stage is supported to be in parallel with respect to said reference surface; and an interferometer according to claim 1.

8. An apparatus according to claim 7, wherein said adjustment mechanism of said interferometer comprises:

a supporting table for supporting said optical element having said beam splitting surface on a major surface thereof; and a rotation mechanism for rotating said beam splitting surface about an axis perpendicular to said major surface while said optical element is supported to be in parallel with respect to said major surface of said supporting table.

9. An apparatus according to claim 7, wherein said optical element of said interferometer is a polarization beam splitter having a surface of said beam splitting surface, which splits the incident light into a first polarized light component as the measurement light component and a second polarized light component as the reference light component, the first and second polarized light components having planes of polarization orthogonal to each other.

10. An apparatus according to claim 8, wherein said adjustment mechanism of said interferometer changes the angle of incidence of the incident light on said beam splitting surface such that the following condition is satisfied:

$$Rp/Tp \leq 16(\pi \cdot \epsilon/\lambda)^2$$

where Rp is the reflectivity of said beam splitting surface for a light component to be transmitted through said beam splitting surface of said optical element, Tp is the transmittance of said beam splitting surface for the light component to be transmitted through said beam splitting surface of said optical element, λ is the wavelength of the incident light, and ε is the allowable measurement error of said interferometer.

11. An exposure apparatus comprising a stage apparatus capable of holding a photosensitive substrate, an illumination optical system for illuminating a mask having a predetermined pattern formed thereon with exposure light having a predetermined wavelength, and a projection optical system for transferring an image of said pattern on said mask onto said photosensitive substrate, said stage apparatus comprising:

a stage allowing said photosensitive substrate to be held on a major surface thereof;

a driving system for moving said stage at least along predetermined directions orthogonal to each other on a predetermined reference surface while said major surface of said stage is supported to be in parallel with respect to said reference surface; and an interferometer according to claim 1.

12. An apparatus according to claim 11, wherein said adjustment mechanism of said interferometer comprises:

a supporting table for supporting said optical element having said beam splitting surface on a major surface thereof; and a rotation mechanism for rotating said beam splitting surface about an axis perpendicular to said major surface while said optical element is supported to be in parallel with respect to said major surface of said supporting table.

13. An apparatus according to claim 11, wherein said optical element of said interferometer is a polarization beam splitter having a surface as said beam splitting surface, which splits the incident light into a first polarized light component as the measurement light component and a second polarized light component as the reference light component, the first and second polarized light components having planes of polarization orthogonal to each other.

14. An apparatus according to claim 12, wherein said adjustment mechanism of said interferometer changes the angle of incidence of the incident light on said beam splitting surface such that the following condition is satisfied:

$$Rp/Tp \leq 16(\pi \cdot \epsilon/\lambda)^2$$

where Rp is the reflectivity of said beam splitting surface for a light component to be transmitted through said beam splitting surface of said optical element, Tp is the transmittance of said beam splitting surface for the light component to be transmitted through said beam splitting surface of said optical element, λ is the wavelength of the incident light, and ε is allowable the measurement error of said interferometer.

* * * * *